US 7,049,609 B2

(12) United States Patent
Takehana

(10) Patent No.: US 7,049,609 B2
(45) Date of Patent: May 23, 2006

(54) METHOD OF VERIFYING PROXIMITY EFFECT CORRECTION IN ELECTRON BEAM LITHOGRAPHY

(75) Inventor: Masakatsu Takehana, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/957,333

(22) Filed: Oct. 1, 2004

(65) Prior Publication Data
US 2005/0140531 A1 Jun. 30, 2005

(30) Foreign Application Priority Data
Oct. 3, 2003 (JP) ............................. 2003-345339

(51) Int. Cl.
*H03M 1/00* (2006.01)
(52) U.S. Cl. ................. 250/492.22; 341/133; 430/296; 703/6; 703/21
(58) Field of Classification Search ................ None
See application file for complete search history.

(56) References Cited
U.S. PATENT DOCUMENTS
6,313,476 B1 * 11/2001 Shimizu et al. ........ 250/492.22

6,499,003 B1 * 12/2002 Jones et al. ..................... 703/6
6,835,942 B1 * 12/2004 Magoshi et al. ........ 250/492.22

FOREIGN PATENT DOCUMENTS
JP 11174659 12/1997

\* cited by examiner

*Primary Examiner*—Nikita Wells
*Assistant Examiner*—Zia R. Hashmi
(74) *Attorney, Agent, or Firm*—The Webb Law Firm

(57) ABSTRACT

Verifying whether correcting data used for proximity effect correction is normal before or during actual lithographic writing. A lithographically written region is virtually divided into subfields. Verification of a correcting value for proximity effect correction for each subfield is normal is made. The correcting values (in percent) for proximity effect corrections for the subfields are stored in a memory. The correcting values are successively supplied to a FIFO and to a comparator. A reference value from a register is also supplied to the comparator. The correcting value for the first subfield r(1) and the output data from the FIFO are supplied to the comparator. The output data from the FIFO includes data about subfields located above and left, respectively, of the subfield r(1). The comparator produces the differences between the incoming values and takes their absolute values. The absolute values are compared with a reference value from the register.

5 Claims, 3 Drawing Sheets

METHOD OF VERIFYING PROXIMITY EFFECT CORRECTION IN ELECTRON BEAM LITHOGRAPHY

BACKGROUND OF THE INVENTION

1. Field of the Invention

The present invention relates to proximity effect correction (PEC) used when a blank mask for optical exposure is fabricated through process steps for delineating a pattern by an electron beam lithographic system in semiconductor device fabrication and, more particularly, to a method of verifying data about the proximity effect correction when electron beam lithography is performed using the proximity effect correction.

2. Description of Related Art

Fabrication of semiconductor devices involves process steps for forming a pattern of various elements and interconnects on a semiconductor wafer using a stepper that is an optical exposure tool. With this stepper, a mask is prepared for the wafer. The wafer is exposed by light transmitted through the mask according to a desired pattern.

The mask consists of a thin metal film fabricated by depositing chromium or other metal onto a glass substrate. Resist is applied on top of the metal film. The mask substrate on which the resist is applied is loaded in an electron beam lithographic machine. A mask pattern is delineated on the surface of the mask substrate by an electron beam. The mask substrate is then developed and etched, thus fabricating the mask substrate on which the desired pattern has been formed.

In recent years, device densities have increased. With this trend, it has been required that the accuracy at which patterns are created by electron beam lithography be increased. Therefore, it is essential to perform proximity effect correction. For example, if patterns are drawn densely by electron beam irradiation, the regions between adjacent patterns exceed the photosensitive level of the resist because of scattering of electrons within the resist. Consequently, patterns will be undesirably created in regions between the adjacent patterns.

Because of this proximity effect, the line width of the formed pattern is increased or patterns are formed between adjacent patterns, for example. As a consequence, the adjacent, independent patterns are connected together, resulting in an integral pattern. Accordingly, as device densities increase, accurate lithographic writing cannot be performed unless the proximity effect is corrected.

Therefore, when individual patterns are written based on pattern data, the dose of the electron beam used during this writing process is reduced, for example, according to the density of the proximate patterns or the spacing between the patterns.

The dose of the electron beam that corresponds to the dwell time of the beam on the material is preset for each individual pattern. When each pattern is delineated based on lithographic data, the dwell time of the beam is adjusted by the blanking operation of the beam according to data about the dwell time corresponding to the pattern. In this way, the proximity effect is alleviated.

Some methods have been developed to perform the proximity effect correction that alleviates the proximity effects. In a recently used method out of these developed methods, a drawn region is divided into subfields. A correcting value for the dose of the electron beam is set for each subfield, taking account of the density of the pattern contained in the surrounding subfields. The correcting values for the dose for the subfields are stored in a memory for proximity effect correction.

After performing the pretreatment for the proximity effect correction as described above, a pattern is actually written on a workpiece by an electron beam. In this case, if pattern data is supplied and individual patterns are written, data about the individual patterns are supplied to a proximity effect correction (PEC) processing unit. This processing unit reads out a correcting value (given in percent) for the dose (e.g., from 0% to 400%) from the memory for PEC according to the coordinates of write positions of each individual pattern, and performs computational calculations for PEC. That is, the dose is adjusted at a specified ratio. Data about the adjusted dose that corresponds to the dwell time of the electron beam is supplied to the blanking portion of the electron optics of the electron beam lithographic machine. The beam is blanked off in a corresponding manner to the adjusted dwell time of the beam.

As described so far, an operation for correcting the proximity effect of the electron beam is performed. However, during the process in which the whole drawn region is divided into subfields and the correcting value for proximity effect correction is calculated for each subfield, calculational errors are produced. Furthermore, during actual lithographic writing, when the correction of the dose is calculated, calculational errors may be produced. With respect to a pattern drawn when such calculational errors are produced, the proximity effect correction is not appropriately made and so lithographic error is produced. Consequently, this region becomes defective. Therefore, it is necessary to verify whether calculations for proximity effect correction have been performed correctly. Examples of implementation of this verification are described, for example, in Japanese Patent No. 11174659 and U.S. Pat. No. 6,313,476.

FIG. 1 is a block diagram schematically showing the configuration of a circuit for performing the prior art proximity effect correction. This circuit includes a control computer 1, such as an engineering workstation (EWS), that transfers lithographic data stored in a disk memory (not shown) to a data expansion circuit 2. The expansion circuit 2 supplies the coordinates of positions of a drawn pattern and data about the dose (data about the dwell time) out of the incoming data to a proximity effect correction (PEC) calculating circuit 3.

A memory 4 for proximity effect correction is connected with the proximity effect correction calculating circuit 3. The ratio of correction (in percent) of the dwell time of the electron beam which is calculated by dividing the delineated region into subfields and taking account of the density of the pattern contained in surrounding subfields of each individual subfield is previously stored in the memory 4.

When the coordinates of the positions of a certain pattern and data about the dwell time are transferred to the proximity effect correction calculating circuit 3, the calculating circuit 3 reads the ratio of correction (in percent) of the dwell time corresponding to the values of the coordinates from the memory 4 for proximity effect correction based on the coordinates of the pattern, and calculates the product of the dwell time and the ratio of correction.

The dwell time is adjusted by this multiplicative processing for proximity effect correction, and data about this adjusted dwell time is supplied to the blanking portion 5 of the electron beam lithographic machine. Therefore, the dwell time of the electron beam on the delineated material or workpiece greatly reduces the proximity effect. Hence, an extremely fine pattern can be drawn at high accuracy, and a high-density pattern can be fabricated accurately.

The output data from the proximity effect correction calculating circuit 3, i.e., data about the dwell time adjusted for proximity effect correction, is also supplied to a comparator circuit 6. The comparator circuit 6 compares the adjusted dwell time from the proximity effect correction calculating circuit 3 with minimum and maximum dwell times stored in a register 7. If the corrected dwell time deviates from the range defined by the minimum and maximum dwell times, it is judged that the dwell time has been miscalculated. The corrected dwell time is stored in an error memory 8 together with the corresponding pattern data.

After completion of all the writing to the workpiece, the control computer 1 reads out data stored in the error memory 8 and executes evaluation of the degree of normalness of the corrected dwell time based on a given criterion reference. Where the corrected dwell time is evaluated as normal, the corresponding pattern whose data has been stored in the error memory 8 is regarded to have been written normally. On the other hand, where the corrected dwell time is evaluated as abnormal, the mask written with the abnormal dwell time is treated as a defective product.

In the aforementioned method of evaluating the degree of normalness of the corrected dwell time in terms of calculational error in the proximity effect correction, the corrected dwell time is found in hardware. Also, it is checked whether the corrected dwell time is contained within the normal range. However, data indicating abnormality that is sent from the error memory 8 is read into the control computer 1 in software. Therefore, it takes a considerable time to evaluate the proximity effect correction. Furthermore, the verification of the normalness of the corrected dwell time is performed after completion of writing to the workpiece. Consequently, if many defects occur, they cannot be found until all the writing is completed.

SUMMARY OF THE INVENTION

It is an object of the present invention to provide a method of verifying correcting data used for proximity effect correction (PEC) in electron beam lithography such that a region to be written lithographically is virtually divided into subfields and that the degree of normalness of a PEC correcting value for each subfield can be verified before or during actual lithographic writing.

A first embodiment of the present invention provides a method of verifying correcting data used for proximity effect correction in an electron beam lithographic machine, the method starting with preparing a workpiece having a resist applied thereon. The workpiece is irradiated with an electron beam to delineate an arbitrary pattern on the surface of the workpiece by the beam. The machine can vary the dwell time of the beam for proximity effect correction. An area that covers the region written by the beam is virtually divided into subfields. A correcting value for proximity effect correction is found for each one of the subfields, taking account of the distribution of pattern elements contained in subfields that are peripheral to that one subfield. When the found correcting value is stored in a PEC memory, the differences between the correcting value for each one subfield of the written region and correcting values for at least two subfields adjacent to that one subfield are found. The absolute values of the differences are compared with a reference value. If the differences between the absolute values and the reference value are within a given range, it is judged that the correcting value is normal.

A second embodiment of the present invention provides a method of verifying correcting data used for proximity effect correction in an electron beam lithographic machine, the method starting with preparing a workpiece having a resist applied thereon. The workpiece is irradiated with an electron beam to delineate an arbitrary pattern on the surface of the workpiece by the beam. The machine can vary the dwell time of the beam for proximity effect correction. An area that covers the region written by the beam is virtually divided into subfields. A correcting value for proximity effect correction is found for each one of the subfields, taking account of the distribution of pattern elements contained in subfields that are peripheral to that one subfield. The found correcting value is stored in a PEC memory. During actual lithographic writing, correcting values for proximity effect correction for subfields where the coordinate positions of a pattern to be written are present are read from the PEC memory. The dwell time of the electron beam determined according to the correcting values for PEC is corrected. The differences between the correcting value for each one subfield of the written region and the correcting values for at least two subfields adjacent to that one subfield are found. The absolute values of the differences are compared with a reference value. If the differences between the absolute values and the reference value are within a given range, it is judged that the correcting value is normal.

A third embodiment of the present invention provides a method of verifying correcting data for proximity effect correction in an electron beam lithographic machine, the method starting with finding the differences between a correcting value for each one of subfields of a written region and correcting values for two subfields located above and left, respectively, of that one subfield. The absolute values of the differences are compared with a reference value.

A fourth embodiment of the present invention provides a method of verifying correcting data for proximity effect correction in an electron beam lithographic machine, the method starting with finding the differences between a correcting value for each one of subfields of a written region and correcting values for four (or, upper, lower, left, and right) subfields adjacent to that one subfield. The absolute values of the differences are compared with a reference value.

A fifth embodiment of the present invention provides a method of verifying correcting data for proximity effect correction in an electron beam lithographic machine, the method being characterized in that the blanking time of the blanking signal for the electron beam is adjusted to vary the dwell time of the beam for proximity effect correction.

In the first embodiment of the present invention, PEC correcting values for the subfields, respectively, are stored in the PEC memory and, at the same time, the stored correcting values are verified. Therefore, before actual lithographic writing is performed, the results of the verification are found. With respect to abnormal correcting values, corresponding countermeasures can be taken.

In the second embodiment of the present invention, PEC correcting values for the subfields, respectively, are stored in the PEC memory. During actual lithographic writing, the PEC correcting values for the subfields where the coordinates positions of the written pattern are present are verified and so results of the verification of the subfields are found before all the writing ends. Consequently, where many abnormal correcting values are produced, the lithographic process can be immediately stopped.

In another feature of the present invention, the absolute value of the difference between the correcting values for adjacent subfields is compared with the reference value. Therefore, the circuit configuration for the verification can be simplified.

Other objects and features of the present invention will appear in the course of the description thereof, which follows.

DESCRIPTION OF THE PREFERRED EMBODIMENTS

Figure 2:
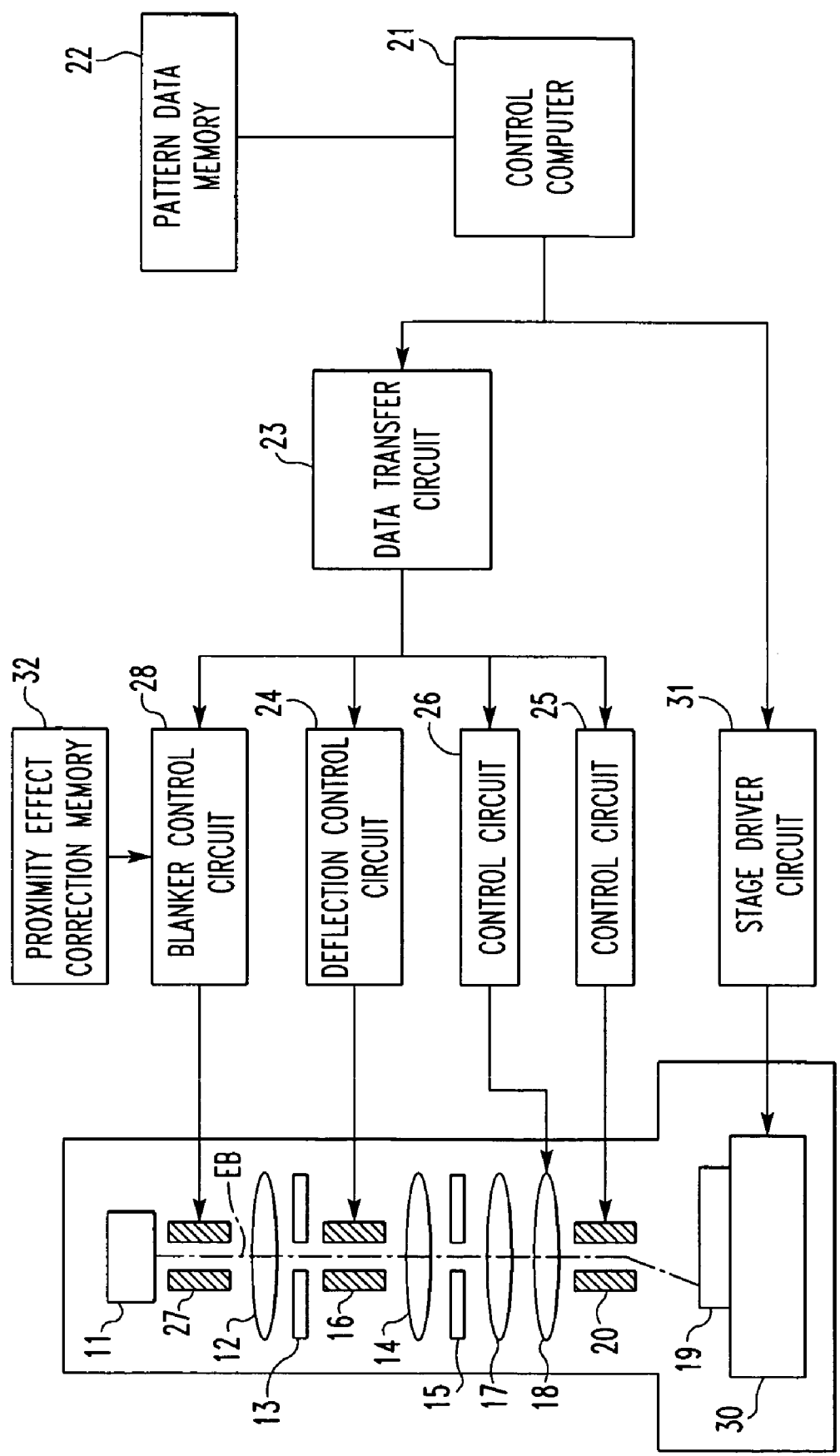
FIG. 2 is a block diagram of the whole construction of one embodiment of the present invention.

Some preferred embodiments of the present invention are hereinafter described in detail with reference to the accompanying drawings. FIG. 2 shows a variable-area electron beam lithographic system for implementing the present invention. The system has an electron gun 11 emitting an electron beam EB, which is directed onto a first shaping aperture 13 via an illumination lens 12.

An image of the opening of the first shaping aperture 13 is focused onto a second shaping aperture 15 by a shaping lens 14. The position of the focus can be varied by a shaping deflector 16. The image shaped by the second shaping aperture 15 is directed at a workpiece 19 through a reduction lens 17 and an objective lens 18. The irradiation position on the workpiece 19 can be varied by a positioning deflector 20.

The system further includes a control CPU 21 that transfers pattern data from a pattern data memory 22 to a data transfer circuit 23. The pattern data from the data transfer circuit 23 is supplied to all of a control circuit 24 controlling the shaping deflector 16, a control circuit 25 controlling the positioning deflector 20, a control circuit 26 controlling the excitation of the objective lens 18, and a blanker control circuit 28 controlling a blanker (blanking electrode) 27 that blanks the electron beam produced from the electron gun 11.

The control CPU 21 controls a driver circuit 31 for a workpiece stage 30 on which the workpiece 19 is placed in order to move the workpiece 19 field by field. A laser interferometer metrology system (not shown) is mounted on the stage portion to measure the amount of movement of the stage. The operation of the structure described so far is next described.

The fundamental writing operation is first described. The pattern data stored in the pattern data memory 22 are successively read out and supplied to the data transfer circuit 23. The deflection control circuit 24 controls the shaping deflector 16 according to the data from the data transfer circuit 23. The control circuit 25 controls the positioning deflector 20.

As a result, the cross section of the electron beam is shaped into an element of a pattern by the shaping deflector 16 according to each piece of the pattern data. Successive elements of the pattern are projected onto the workpiece 19. In this way, the pattern of the desired shape is written. At this time, the electron beam is blanked by the blanking signal from the blanker control circuit 28 to the blanker 27 in synchronism with the irradiation of the workpiece 19 with the electron beam.

When a different region on the workpiece 19 is written, the stage 30 is moved a given distance under instructions given from the control CPU 21 to the stage driver circuit 31. This distance is being monitored by the laser metrology system (not shown). The position of the stage 30 is accurately controlled according to the results of the metrology performed by the laser metrology system.

The blanker control circuit 28 supplies the blanking signal to the blanker 27 such that a preset dwell time of the electron beam is achieved. The dose of the beam EB impinging on the workpiece 19 can be varied by varying the dwell time. Accordingly, proximity effect correction can be performed by controlling the blanking signal supplied to the blanker 27 from the blanker control circuit 28 so as to adjust the dwell time of the beam.

Therefore, a proximity effect correction (PEC) memory 32 is connected with the blanker control circuit 28. The written region on the workpiece 19, i.e., the used region R for which calculations are performed for proximity effect correction, is virtually divided into subfields. A correcting value (ratio to a reference dose value or to a reference dwell time) for proximity effect correction is determined for each subfield and expressed in terms of percent. These correcting values for the subfields are stored in the PEC memory 32.

Figure 1:
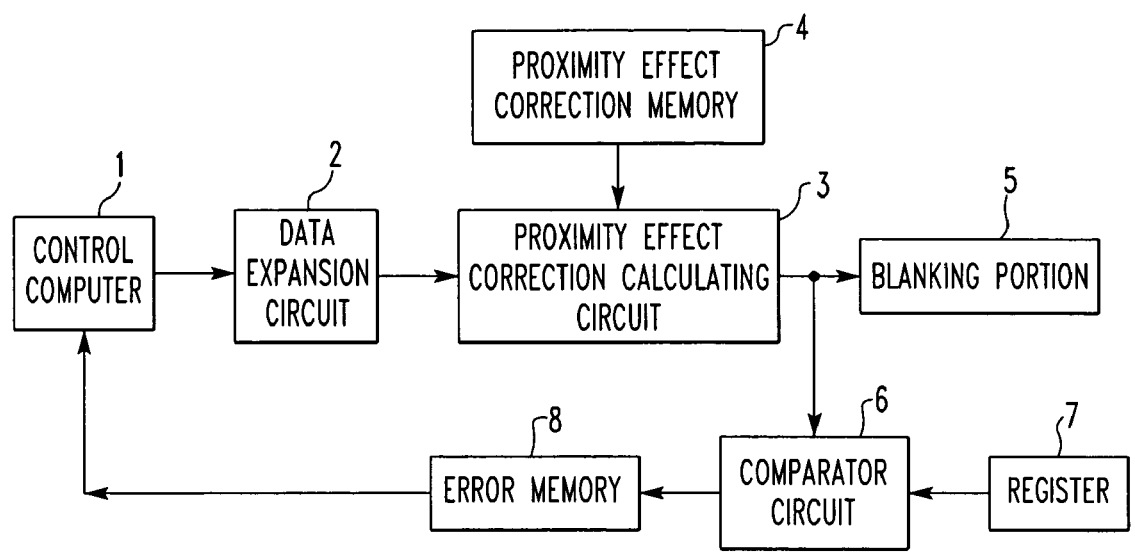
FIG. 1 is a block diagram illustrating the prior art method of verifying data used for proximity effect correction.
Figure 3:
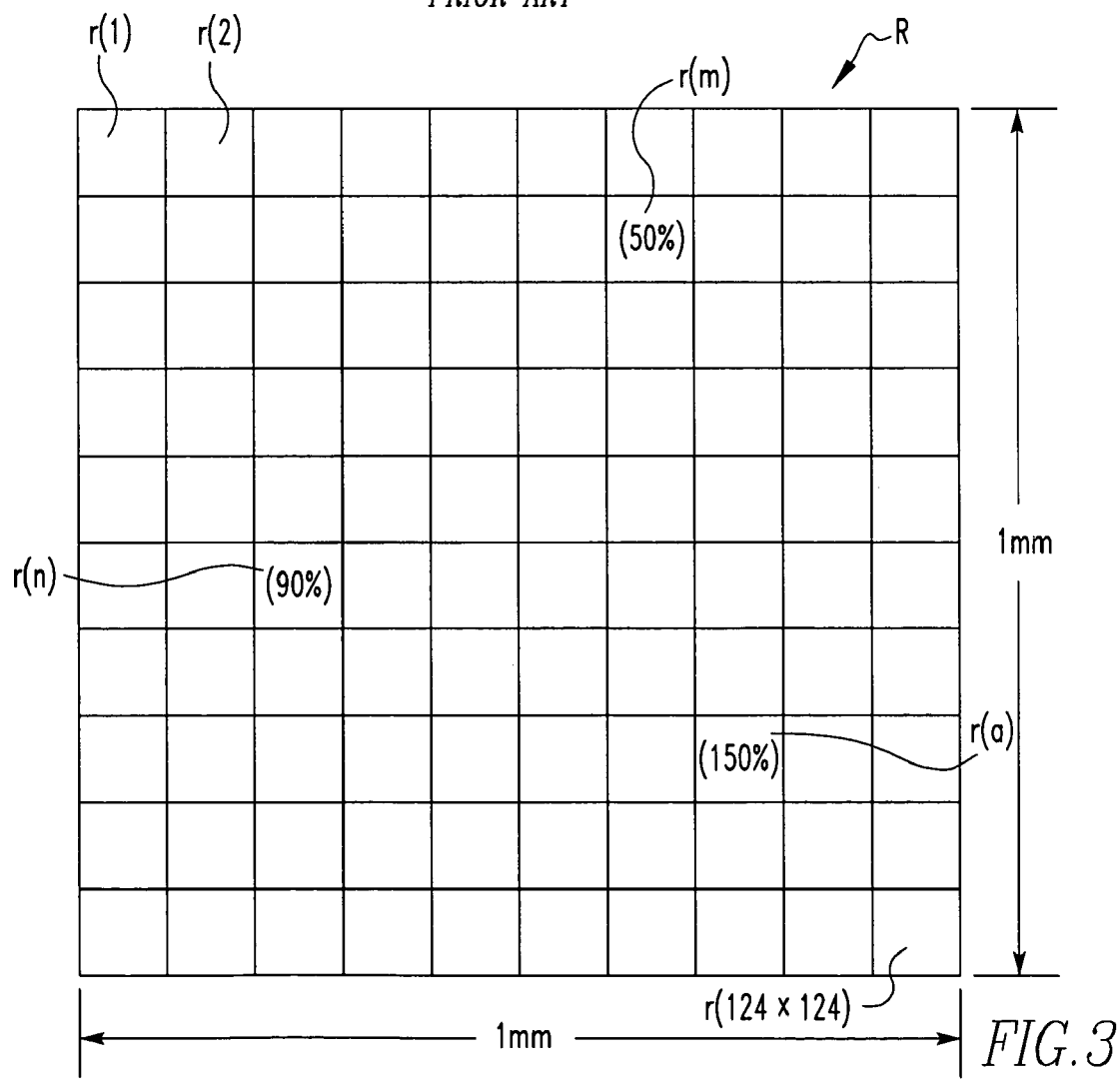
FIG. 3 is a diagram illustrating a proximity effect correction (PEC) memory.

FIG. 3 illustrates the region R for calculations for proximity effect correction. The region R is 1 mm square and virtually divided into 124×124 subfields r(1)–r(124×124). (For drawing simplicity, 10×10 subfields are illustrated.) PEC correcting values (in percent) for the 124×124 subfields are stored in a corresponding manner to the density of the pattern distribution across these subfields. For example, 50% is stored as a PEC correcting value for the subfield r(m), and 90% is stored as a PEC correcting value for the subfield r(n).

During actual writing, data supplied from the pattern data transfer circuit 23 to the blanker control circuit 28 contains coordinate values of elements of a pattern. Each element of the pattern is written by a single shot of the beam. The blanker control circuit 28 reads out PEC correcting values for the subfields, including the coordinate values of the elements of the pattern, from the PEC memory 32. For example, if a coordinate value of the elements is present within the subfield r(m), a value of 50% is read out as a PEC correcting value. This value of 50% is multiplied with a reference dwell time T. During actual writing, each single dwell time is set to 0.5T. The dose is set to half of the reference value. The PEC correcting value for each subfield r is determined, also taking account of the density of the pattern in surrounding subfields affecting the subfield r.

The PEC correcting values for the subfields r(1)–r(124×124) obtained by virtually dividing the region R are previously calculated according to the density of the pattern existing around each subfield and are stored in the PEC memory 32. Some of the correcting values may assume abnormal values due to calculational errors.

If proximity effect correction is performed using these abnormal values and the electron beam is made to hit the workpiece, and if the abnormal values are large, the dose of the electron beam is too great, increasing the pattern width or connecting together adjacent independent patterns. Conversely, if the correcting values are too small, and if thin lines are arranged at narrow spacing in the pattern, the dose is not sufficient to expose the resist. As a result, the necessary pattern will not be formed. Where the correcting values for proximity effect correction are abnormal in this way, the created mask will contain defective parts.

For this reason, it is necessary to check whether the correcting values stored in the PEC memory 32 are normal or abnormal. For example, with respect to any subfield for which an abnormal correcting value has been found, this correcting value can be immediately recalculated and replaced by a normal correcting value. Where lithography is performed using abnormal values, any chip containing subfields resulting in abnormal values is recognized as defective. Out of numerous chips finally fabricated, those chips containing subfields recognized to be defective can be treated as defective products without being inspected.

Figure 4:
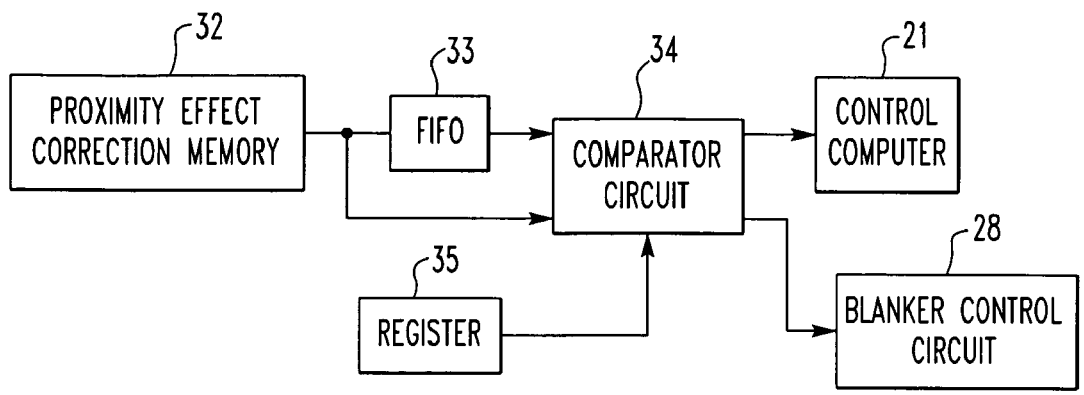
FIG. 4 is a block diagram showing the circuit configuration for implementing a method of verifying data used for proximity effect correction in accordance with the present invention.

In the embodiment illustrated in FIG. 2, the blanker control circuit 28 includes a circuit for verifying the PEC correcting values for the subfields r, the values being stored in the PEC memory 32. FIG. 4 shows one example of the circuit configuration for verifying the PEC correcting values. The PEC correcting values (in percent) for the subfields stored in the PEC memory 32 are successively supplied to a FIFO 33 for temporarily storing its input data and to a comparator circuit 34. A reference value from a register 35 is also supplied to the comparator circuit 34.

Figure 5:
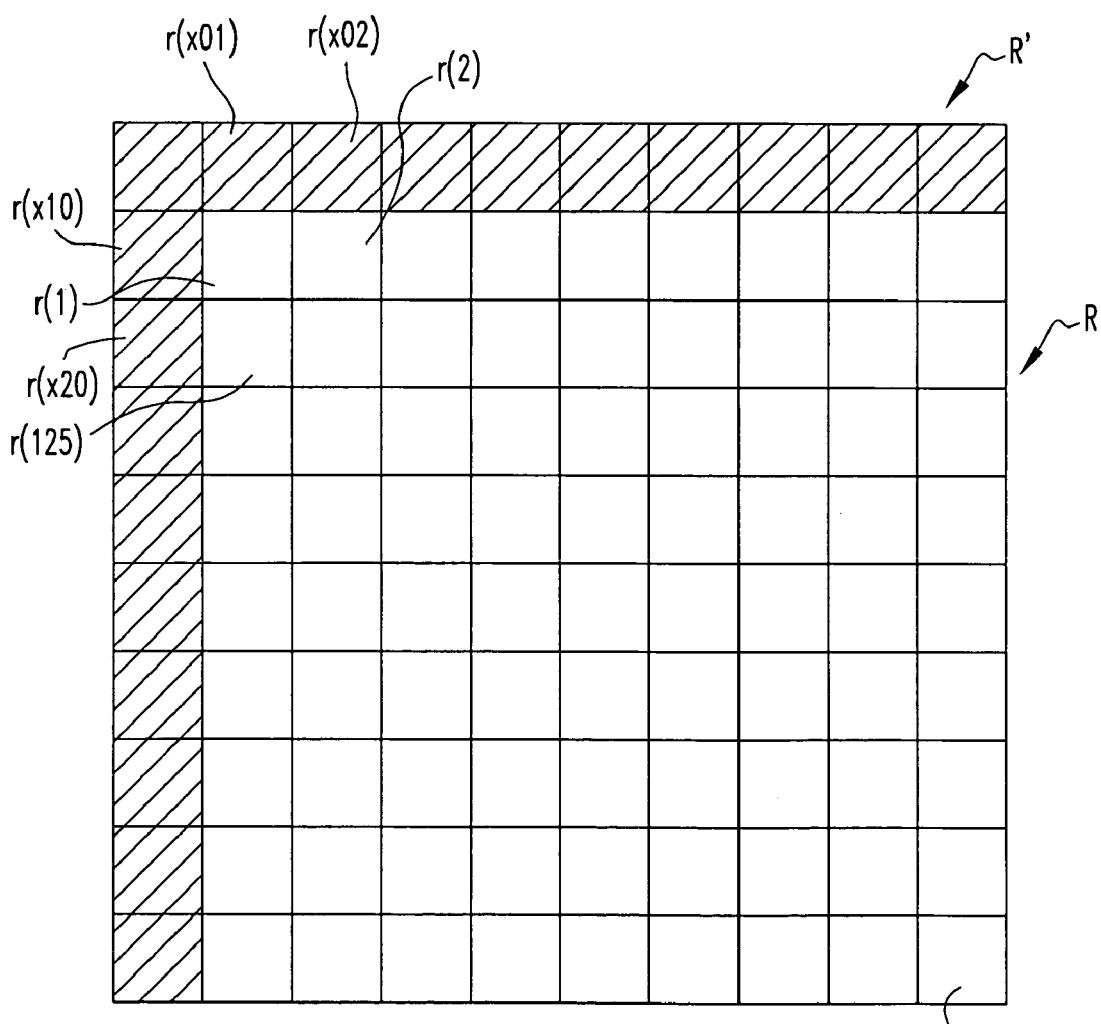
FIG. 5 is a diagram illustrating a proximity effect correction (PEC) memory.

In this configuration, when data about PEC correcting values calculated by a separate operation are entered into the PEC memory 32, data about a region R' slightly wider than the region R used during actual lithographic writing shown in FIG. 5 is also read in. In FIG. 5, the region R' is used for calculations of proximity effect corrections. The region R' includes hatched peripheral subfields that are outside the region R and are not used during actual writing. Data read into the memory 32 are all input into the FIFO 33, where the data are temporarily held.

The data are entered in succession in an order starting from the subfield r(x01) located outside the region R'. When data about the correcting value for the first subfield r(1) in the region R used during actual writing are supplied, data about the correcting value $\Delta 1$ for the subfield r(1) and data read from the FIFO 33 are supplied to the comparator circuit 34. At this time, the data read from the FIFO 33 are data, or correcting value, $\Delta x01$ about the subfield r(x01) located on top of the subfield r(1) and data, or correcting value, $\Delta x10$ about the subfield r(x10) located at the left of the subfield r(1).

The comparator circuit 34 produces the difference (absolute value) between the values $\Delta 1$ and $\Delta x01$ and the difference (absolute value) between the values $\Delta 1$ and $\Delta x10$. The produced differences (absolute values) are compared with reference value $\Delta s$ from the register 35. If the results of the comparisons satisfy the following relations, the correcting value $\Delta 1$ for the subfield r(1) is judged to be normal and the error flag is not set:

$$|\Delta 1 - \Delta x01| < \Delta s$$

$$|\Delta 1 - \Delta x10| < \Delta s$$

Conversely, if the comparison between the differences and the reference value $\Delta s$ from the register 35 indicates that the absolute values of the differences are greater than the reference value $\Delta s$, i.e., any one of the following relations holds, the correcting value $\Delta 1$ for the subfield r(1) is taken as an abnormal value and the error flag is set. Information indicating these facts is sent to the control CPU 21.

$$|\Delta 1 - \Delta x01| \geq \Delta s$$

$$|\Delta 1 - \Delta x10| \geq \Delta s$$

When data about the correcting value for the subfield r(2) is subsequently supplied, data about the correcting value $\Delta 2$ for the subfield r(2), and data read from the FIFO 33 are supplied to the comparator circuit 34. At this time, the data read from the FIFO 33 include data (correcting value) $\Delta x02$ about the subfield r(x02) located over the subfield r(2) and data (correcting value) $\Delta 1$ about the subfield r(1) located at the left of the subfield r(2).

The comparator circuit 34 produces the difference (absolute value) between the values $\Delta 2$ and $\Delta 1$ and the difference (absolute value) between the values $\Delta 2$ and $\Delta x02$. These two differences are compared with the reference value $\Delta s$ from the register 35. If the results of the comparisons show the following relations, the data about the correcting value $\Delta 2$ for the subfield r(2) is taken as normal and the error flag is not set:

$$|\Delta 2 - \Delta x02| < \Delta s$$

$$|\Delta 2 - \Delta 1| < \Delta s$$

Conversely, where the result of the comparison between the differences and the reference value $\Delta s$ from the register 35 indicates that the absolute values of the differences are greater than the reference value $\Delta s$, i.e., any one of the following relations holds, data about the correcting value $\Delta 2$ for the subfield r(2) is taken as an abnormal value and the error flag is set. Information indicating these facts is supplied to the control CPU 21.

$$|\Delta 2 - \Delta x02| \geq \Delta s$$

$$|\Delta 2 - \Delta 1| \geq \Delta s$$

In this way, whenever a PEC correcting value for each one of the subfields obtained by virtually dividing the drawn region is entered into the PEC memory 4, the difference between the values about the subfields located above and left, respectively, of the subfield for which an entry is being made is found. The absolute value of the difference is compared with the reference value. A verification as to whether PEC correcting data is normal or abnormal can be made for all the subfields. For subfields found to produce abnormal correcting values as a result of these verifications, the PEC correcting values are recalculated and replaced by correct PEC correcting values.

The PEC correcting values for the subfields are verified by a similar method. When the verification of the correcting value for the final subfield r(124×124) ends, data about the subfields resulting in abnormal correcting values are stored in the control CPU 21. The CPU 21 commands recalculations of the correcting values for the subfields resulting in the abnormal correcting values, or alternatively, starts a writing operation without modifying the abnormal correcting values for the subfields and treats chips containing subfields resulting in the abnormal correcting values as defective products.

In the above-described embodiment, when correcting values are supplied to the PEC memory 32, a verification is made as to whether the correcting value for each subfield is normal or not. When the correcting values are stored in the memory 32, the correcting values may not be verified; rather a verification may be made as to whether each correcting value is normal simultaneously with a writing operation during actual writing. In this case, as the writing position is moved, the subfield for which a single operation for proximity effect correction is performed is also shifted. A verification as to whether the correcting value is normal or not is made for the successively shifting subfield.

For example, when a pattern is started to be delineated in the subfield r(1), a verification is made as to whether the correcting value is normal or not by the aforementioned method. The PEC correcting value Δ1 for the region r(1) read from the PEC memory 32 is supplied to the blanker control circuit 28 via the comparator circuit 34. The blanker control circuit 28 calculates the product of the reference dwell time T and the PEC correcting value Δ1, resulting in an electron beam dwell time. Using this, a blanking signal is created and supplied to the blanker 27.

Similarly, when a pattern element contained in the subfield r(2) is drawn, a verification is made as to whether the PEC correcting value is normal. At the same time, the PEC correcting value Δ2 for the subfield r(2) is read from the PEC memory 32 and multiplied with the reference dwell time T. Accordingly, also with respect to the subfield r(2), the workpiece 19 is irradiated with the electron beam with the dwell time to correct the proximity effect.

In this way, in delineating a pattern element contained in each subfield, the electron beam is directed at the workpiece for a dwell time to correct the proximity effect of the subfield. Hence, a pattern for which the proximity effect has been corrected is delineated accurately on the workpiece. On the other hand, if the PEC correcting values for some subfields are judged to be abnormal, the coordinates of these subfields are stored in the control CPU 21. Chips in the coordinates of these subfields are finally treated as defective products under instructions from the CPU 21.

In the embodiment described so far, a verification as to whether correcting data for proximity effect is normal is made by detecting the differences between the PEC correcting value about each one subfield and PEC correcting values about subfields located over and left of that one subfield and comparing the absolute values of the differences with a reference value. In addition, if a similar verification may be made regarding the subfields located under and right of that subfield, a more accurate verification may be made.

In the description provided so far, verification of PEC correcting values is made regarding a variable-area electron beam lithographic machine. The invention is not limited to this type of lithographic machine. The invention can be applied to a lithographic machine in which resist is exposed (e.g., a pattern is exhaustively scanned by a sharply focused electron beam).

Having thus defined my invention with the detail and particularity required by the Patent Laws, what is desired protected by Letters Patent is set forth in the following claims.

The invention claimed is:

1. A method of verifying correcting data used for proximity effect correction in an electron beam lithographic machine for irradiating a workpiece having a resist applied thereon with an electron beam to delineate a on a surface of the workpiece by the beam, the machine being capable of irradiating the workpiece by the beam with a variable dwell time for proximity effect correction, said method comprising the steps of:

virtually dividing an area that covers a region written by the beam into subfields;

finding a correcting value for proximity effect correction for each one of the subfields, taking account of the distribution of pattern elements contained in subfields peripheral to each one subfield and storing in a PEC memory;

finding the differences between the correcting value for each subfield of the written region and correcting values for at least two subfields adjacent to that one subfield when the found correcting value is stored in said PEC (proximity effect correction) memory;

comparing absolute values of the differences with a reference value; and judging the correcting value to be normal when the differences between the absolute values and the reference value are within a given range.

2. A method of verifying correcting data used for proximity effect correction in an electron beam lithographic machine for irradiating a workpiece having a resist applied thereon with an electron beam to delineate a pattern on a surface of the workpiece by the beam, the machine being capable of irradiating the workpiece by the beam with a variable dwell time for proximity effect correction, said method comprising the steps of:

virtually dividing an area that covers a region written by the beam into subfields;

finding a correcting value for proximity effect correction for each of the subfields of the written region, taking account of the distribution of pattern elements contained in subfields peripheral to each one subfield;

storing the found correcting values in a PEC (proximity effect correction) memory;

reading correcting values for proximity effect correction for subfields where coordinate positions of the delineated pattern are present from the PEC memory during actual lithographic writing;

correcting the dwell time of the electron beam determined according to the correcting values;

finding the differences between the correcting value for each one subfield of the written region and correcting values for at least two subfields adjacent to that one subfield;

comparing absolute values of the differences with a reference value; and judging the correcting values to be normal when the differences between the absolute values and the reference value are within a given range.

3. A method of verifying correcting data used for proximity effect correction in an electron beam lithographic machine as set forth in any one of claims 1 and 2, wherein differences between a correcting value for each one of the subfields of the written region and correcting values for two subfields located above and left, respectively, of that one subfield are found, and wherein absolute values of the differences are compared with the reference value.

4. A method of verifying correcting data used for proximity effect correction in an electron beam lithographic machine as set forth in any one of claims 1 and 2, wherein differences between a correcting value for each one of the subfields of the written region and correcting values for four subfields located above, below, left, and right, respectively, of that one subfield are found, and wherein absolute values of the differences are compared with the reference value.

5. A method of verifying correcting data used for proximity effect correction in an electron beam lithographic machine as set forth in any one of claims 1 and 2, wherein a blanking signal having a variable blanking time is used for the electron beam, and wherein the blanking time is adjusted to vary the dwell time of the electron beam, for proximity effect correction.

* * * * *